US010756041B1

(12) United States Patent
Arvin et al.

(10) Patent No.: US 10,756,041 B1
(45) Date of Patent: Aug. 25, 2020

(54) FINNED CONTACT

(71) Applicant: International Business Machines Corporation, Armonk, NY (US)

(72) Inventors: Charles L. Arvin, Poughkeepsie, NY (US); Brian M. Erwin, Millbrook, NY (US); Clement J. Fortin, Quebec (CA); Chris Muzzy, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/353,411

(22) Filed: Mar. 14, 2019

(51) Int. Cl.
  *H05K 3/34* (2006.01)
  *H01L 23/00* (2006.01)
  *H01L 23/498* (2006.01)
  *H01L 21/48* (2006.01)

(52) U.S. Cl.
  CPC .......... *H01L 24/13* (2013.01); *H01L 21/4853* (2013.01); *H01L 23/49811* (2013.01); *H01L 24/11* (2013.01); *H01L 2224/11462* (2013.01); *H01L 2224/11474* (2013.01); *H01L 2224/13014* (2013.01); *H01L 2224/13019* (2013.01); *H01L 2224/1366* (2013.01); *H01L 2224/13147* (2013.01); *H01L 2224/13564* (2013.01); *H01L 2224/13582* (2013.01); *H01L 2224/13644* (2013.01); *H01L 2224/13647* (2013.01); *H01L 2224/13655* (2013.01); *H01L 2924/3841* (2013.01)

(58) Field of Classification Search
  CPC .. H01L 23/49811; H01L 24/12; H05K 3/3436
  See application file for complete search history.

(56) References Cited

U.S. PATENT DOCUMENTS

| 7,087,458 | B2 | 8/2006 | Wang et al. |
| 7,569,935 | B1 | 8/2009 | Fan |
| 8,967,452 | B2 | 3/2015 | Cheung et al. |
| 9,911,708 | B2 | 3/2018 | Arvin et al. |
| 9,953,939 | B2 | 4/2018 | Lin et al. |
| 2005/0124181 | A1* | 6/2005 | Brown .................... H01L 24/72 439/66 |
| 2016/0190082 | A1* | 6/2016 | Tsai .................. H01L 23/49822 257/737 |
| 2017/0018525 | A1 | 1/2017 | Dias et al. |
| 2017/0040275 | A1 | 2/2017 | Venkatadri |

FOREIGN PATENT DOCUMENTS

CN  102543783  6/2015

* cited by examiner

*Primary Examiner* — Thomas L Dickey
(74) *Attorney, Agent, or Firm* — ZIP Group PLLC

(57) ABSTRACT

A finned contact of an IC device may be utilized to electrically connect the IC device to external circuitry. The finned contact may be fabricated by forming a base upon the IC device and subsequently forming two or more fins upon the base. Each fin may be formed of the same and/or different material(s) as the base. Each fin may include layer(s) of one or materials. The fins may be located upon the base inset from the sidewall(s) of the base. The fins may be arranged as separated ring portions that are concentric with the base. The fins may drive current into the external circuitry connected thereto. Solder may be drawn towards the center of the base within an inner void that is internal to the fins, thereby limiting the likelihood of solder bridging with a neighboring contact.

20 Claims, 13 Drawing Sheets

FINNED CONTACT

FIELD

Embodiments of invention generally relate to the fabrication of integrated circuit (IC) devices, such as a wafer, a die, a die carrier, an IC package, etc. More particularly, embodiments relate to a finned contact of an IC device.

BACKGROUND

Formation of IC devices utilize plating processes. During plating, a metal or other electrically conductive material is plated from an exposed surface. In certain implementations, the electrically conductive material takes the form of contacts, solder bumps, etc. that are utilized to electrically connect the IC device to external circuitry.

As the size of some IC devices is shrinking, it may become important to achieve adequate current carrying capabilities of contacts that electrically connect IC device to external circuitry while also limiting the likelihood of undesirable electrical shorting of neighboring contacts due to bridging (e.g., solder bridging, etc.) or the like.

SUMMARY

In an embodiment of the present invention, an integrated circuit (IC) device is presented. The IC device includes an electrically conductive contact base comprising an external circuitry facing base surface and one or more base sidewalls. The IC device includes a plurality of fins that extend from the external circuitry facing base surface. The fins are inset from at least one of the base sidewalls. Each fin includes an inner fin wall(s) that face a center of the base and that are concentric with at least one of the base sidewalls. Each fin further includes an outer fin wall(s) that face and are concentric with at least one of the base sidewalls. Each fin further includes an external circuitry facing fin surface between the inner fin wall(s) and the outer fin wall(s). The IC device further includes an interior void internal to the inner fin wall(s) of each fin from the external circuitry facing base surface to the external circuitry facing fin surfaces of each fin.

In another embodiment of the present invention, an integrated circuit (IC) die package is presented. The IC die package includes a finned contact and an external circuitry contact. The finned contact includes an electrically conductive contact base that includes an external circuitry facing base surface and one or more base sidewalls. The finned contact further includes a plurality of fins that extend from the external circuitry facing base surface. The plurality of fins are inset from at least one of the base sidewalls. Each fin includes an inner fin wall(s) that face a center of the base and that are concentric with at least one of the base sidewalls, an outer fin wall(s) that face and are concentric with at least one of the base sidewalls, and an external circuitry facing fin surface between the inner fin wall(s) and the outer fin wall(s). The finned contact further includes an interior void internal to the inner fin wall(s) of each fin from the external circuitry facing base surface to the external circuitry facing fin surfaces of each fin. The IC die package further includes solder within the interior void that connects the finned contact with the external circuitry contact.

In yet another embodiment, a finned contact fabrication method is presented. The fabrication method includes forming a contact base within a contact base trench within a first mask upon an IC device surface. The fabrication method further includes forming a second mask upon the contact base and upon the first mask. The fabrication method further includes forming a plurality of fin trenches within the second mask exposing portions of the contact base. The fabrication method further includes forming a fin upon an exposed portion of the contact base within each of the plurality of fin trenches.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Various embodiments are related to a finned contact of an IC device that are utilized to electrically connect the IC device to external circuitry. The finned contact may be fabricated by forming a base upon the IC device and subsequently forming two or more fins upon the base. Each fin may be formed of the same and/or different material(s) as the base. Each fin may include layer(s) of one or materials. The fins may be located upon the base inset from the sidewall(s) of the base. The fins may be arranged as separated ring portions that are concentric with the base. The fins may drive current into the external circuitry connected thereto. Solder may be drawn towards the center of the base within an inner void that is internal to the fins, thereby limiting the likelihood of solder bridging with a neighboring contact.

Referring now to the FIGs, wherein like components are labeled with like numerals, exemplary embodiments that involve a die carrier, IC device, such as a wafer, die, etc. in accordance with embodiments of the present invention are shown, and will now be described in greater detail below. It should be noted that while this description may refer to components in the singular tense, more than one component may be depicted throughout the FIGs. The specific number of components depicted in the FIGs. and the orientation of the structural FIGs. was chosen to best illustrate the various embodiments described herein.

Figure 1:
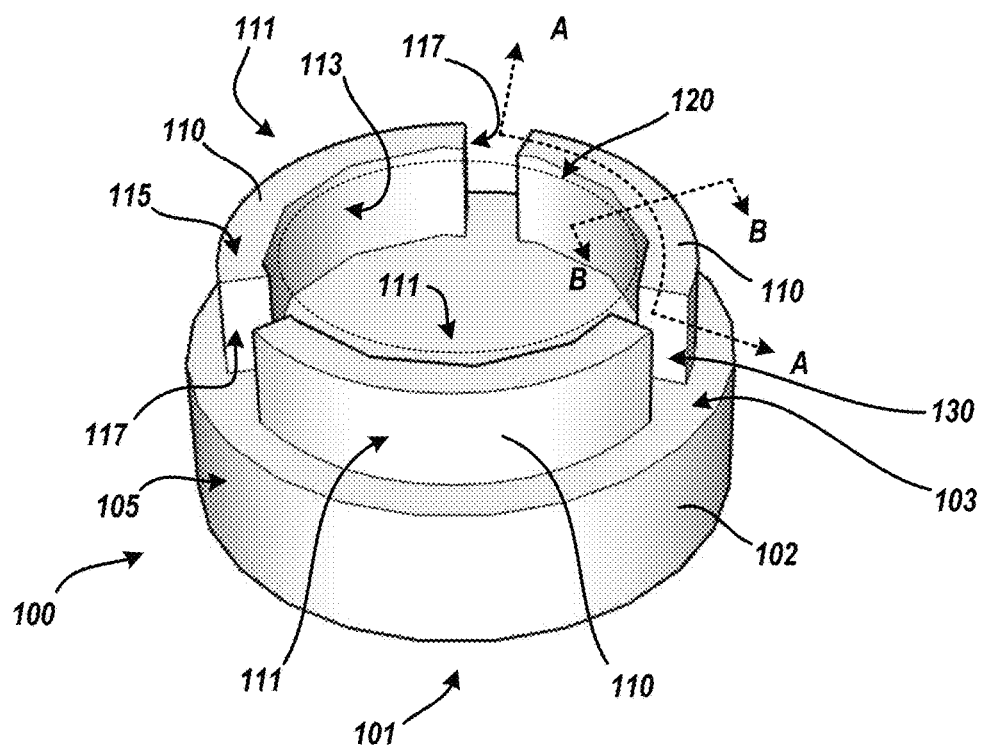
FIG. 1 depicts an isometric view of an exemplary finned contact, according to one or more embodiments of the present invention.
Figure 2:
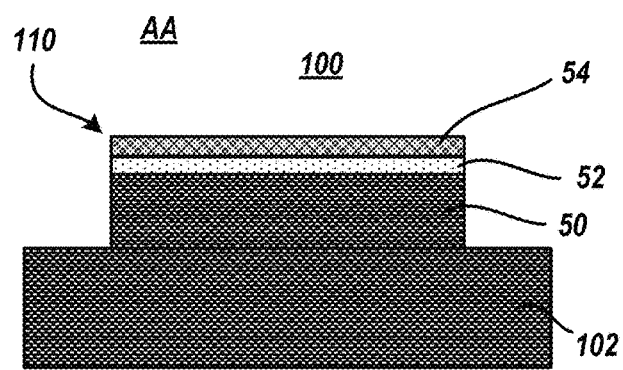
FIG. 2 and FIG. 3 depict cross-section views of an exemplary finned contact, according to one or more embodiments of the present invention.
Figure 3:
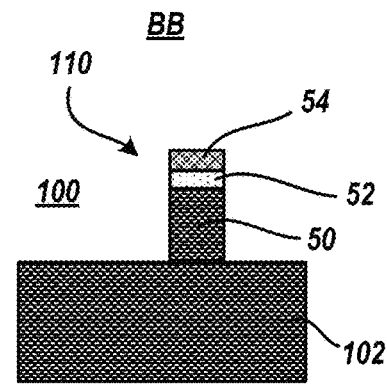

FIG. 1 depicts an isometric view of a finned contact 100 and FIG. 2 and FIG. 3 depict cross-section views of finned contact 100. Finned contact 100, also referred herein as contact 100, includes a base 102 and two or more fins 110 that extend from the base portion. Base 102 may include an IC device facing surface 101, an external circuitry facing surface 103, and one or more sidewall(s) 105 that connect the IC device facing surface 101 and the external circuitry facing surface 103. Though shown as a circular pillar, disc, or the like, base 102 may be a pillar, disc, etc. of a different shape. For example, base 102 may be a square pillar, rectangular pillar, hexagonal pillar, etc. The IC device facing surface 101 may be parallel with the external circuitry facing surface 103 and the sidewall(s) 105 may be perpendicular (as shown) or angled relative IC to device facing surface 101 and/or external circuitry facing surface 103. For example, sidewall(s) 105 may be acutely angled relative to IC to device facing surface 101 and obtusely angled relative to external circuitry facing surface 103. Base 102 may be an electrically conductive material such as a metal, Copper, or the like.

Each fin 110 may extend from external circuitry facing surface 103 of the base 102. Each fin 110 may include an outer sidewall 111, an inner sidewall 113, external circuitry facing surface 115, and fin facing surface(s) 117. The fin facing surface 117 of one fin 110 is separated from an associated fin facing surface 117 of a neighboring fin 100 by separation 130 that exists from a plane of the external circuitry facing surface 115 to a plane of external circuitry facing surface 103. As there are a least two fins 110 that extend from base 102, there are at least two associated separations 130. When the fins 110 are concentric with sidewalls 105, when base 102 is a square, hexagonal, etc. pillar, separations 130 may exist at each intersection (e.g. the corners) of two neighboring fins 110. Fin facing surface 117 may be perpendicular with external circuitry facing surface 103.

As is shown, each outer sidewall 111 of each fin 110 may be concentric with the base 102 and may have the same radius. Alternatively, or in addition, each outer sidewall 111 of each fin 110 may be inset from an associated sidewall 105 of base 102 by a same dimension. For example, if base 102 is a square pillar, each sidewall 111 of each fin 110 may be inset from an associated parallel sidewall 105 of the square pillar. Similarly, each inner sidewall 113 of each fin 110 may be concentric with the base 102 and may have the same radius and/or each inner sidewall 113 of each fin 110 may be inset from an associated sidewall 105 of base 102 by a same dimension. Outer sidewall 111 may be parallel with the inner sidewall 113 of the same fin 110. Outer sidewall 111 and inner sidewall 113 may be both perpendicular with external circuitry facing surface 103.

Each external circuitry facing surface 115 of each fin 110 may be coplanar. Each external circuitry facing surface 115 may be parallel with external circuitry facing surface 103. A dimension from the external circuitry facing surface 115 to external circuitry facing surface 103 may be the same as a dimension from external circuitry facing surface 103 to IC device facing surface 101. That is, the height of fin 110 may be the same as the height of the base 102.

In an embodiment, each inner sidewall 113 of each fin 110 is offset and concentric with the center of base 102. In such embodiments, an inner void 120 is thereby formed by each inner sidewall 113 of each fin 110. As such, inner void 120 may exist interior to each inner sidewall 113 of each fin 110 from external circuitry facing surface 103 to external circuitry facing surface 115. Inner void 120 may be open or is otherwise generally accessible by each separation 130. During solder reflow, solder may be draw toward the center of contact 100 within inner void 120.

Each fin 110 may include layer(s) of one or materials. For example, fin 110 may include a layer 50 formed upon the base 102, a layer 52 formed upon layer 50, and a layer 54 formed upon layer 52.

Layer 52 may be an electrically conductive material such as the same material as base 102, or the like. Layer 52 may be an electrically conductive material, such as metal, Nickel, or the like. Layer 54 may be an electrically conductive material, such as the same material as base 102, Gold, or the like. In an embodiment, connector 100 includes base 102 formed of Copper, layer 50 formed of Copper, layer 52 form of Nickel, and layer 54 formed of Copper. In another embodiment, connector 100 includes base 102 formed of Copper, layer 50 formed of Copper, layer 52 form of Nickel, and layer 54 formed of Gold.

If all layers 50, 52, and 54 are Copper, the structure may aid in the prevention of shorting during chip join. If layers 50, 52, and/or 54 are different and/or multiple materials, the resulting structure enhances current carrying capability both when multiple reflows occur on the same device and for long term electromigration performance. This long term performance may be necessary for applications such as high end servers and for automotive applications that must survive decades in the field. The multilayer structure may also assist in forcing current to the fins 110. Forcing current means the highest current density through the connector 100 will be through the fin 110 or combination of fins 110. When layer 52 is Nickel, layer 52 raises the activation energy needed to remove a Copper atom of the fin 110 and into the solder 60. Layer 54 may exist in order to enable wetting of the solder 60 to the tip of fin 110 when Nickel is present. Without layer 54 (when Nickel is present), the tip of fin 110 may not wet and current would transfer from the side of the fin 110 and not the tip which would reduce current spreading across the shape of the contact 100.

For clarity, though a multilayer structure is shown, other layer(ed) embodiments are contemplated. For example, layers 52 and 54 may be combined in single layer if a metal that is both a barrier and which solder may wet (e.g. NiFe, or the like), or the like. NiFe acts both as a barrier and can be wetted by the solder much more readily than Ni with its native oxide.

Figure 4:
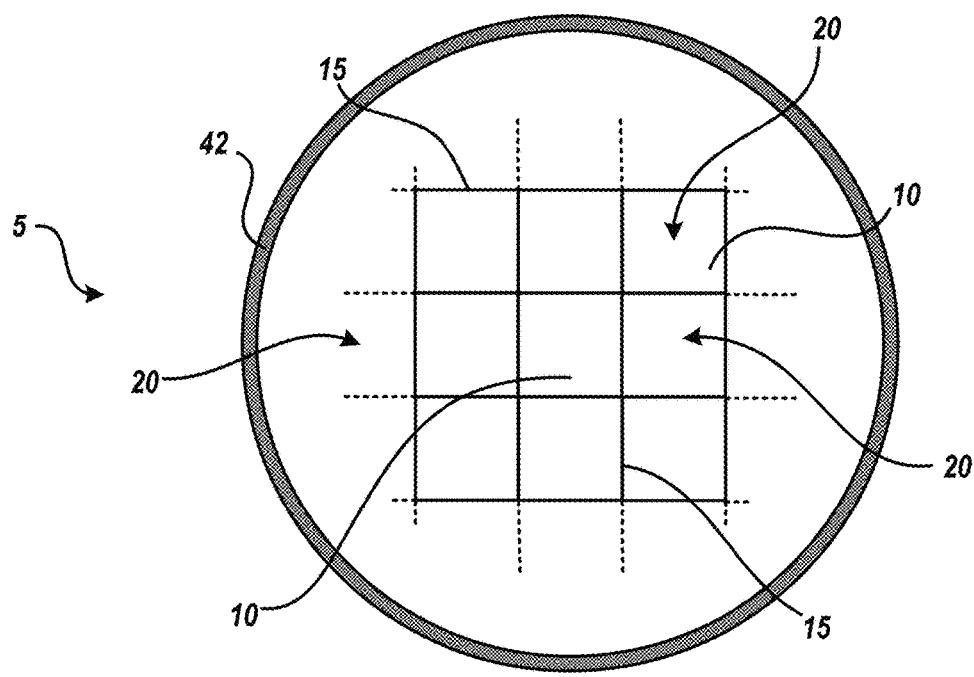
FIG. 4 depicts a semiconductor wafer that may include various embodiments of the present invention.

FIG. 4 depicts a semiconductor wafer 5, in accordance with various embodiments of the present invention. Wafer 5 may include a plurality of dies 10 separated by kerfs 15. Each die 10 may include an active region 20 wherein integrated circuits including microdevices may be built using microfabrication process steps such as doping or ion implantation, etching, deposition of various materials, photolithographic patterning, wire formatting, plating, etc. Wafer 5 may also include an exposed electrically conductive area 42 that which a plating tool electrically contacts wafer 5 to enable plating of electrically conductive materials onto wafer 5. The wafer 5 may be diced at kerf 15 to form individual dies 10.

Figures 5, 6:
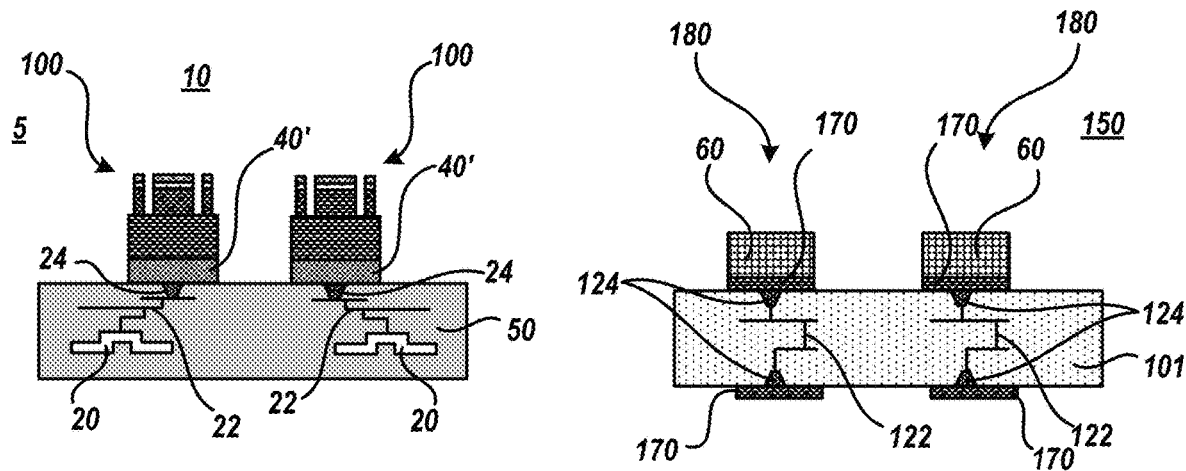
FIG. 5 depicts a cross section view of an IC device that may include various embodiments of the present invention.
FIG. 6 depicts a cross section view of an IC die carrier that may be utilized by various embodiments of the present invention.

FIG. 5 depicts a cross section view of a portion of an IC device, such as wafer 5, die 10, or the like, in accordance with various embodiments of the present invention. The IC device may include a semiconductor substrate 50, a microdevice 20, wiring 22, wiring contact 24 therein. The IC device includes contact 100 which may be formed directly upon substrate 50 or may be formed upon substrate 50 by forming contact 100 directly upon a residual plating portion 40' (as shown).

The semiconductor substrate 50 may include but is not limited to: any semiconducting material such conventional Si-containing materials, Germanium-containing materials, GaAs, InAs and other like semiconductors. Si-containing materials include, but are not limited to: Si, bulk Si, single crystal Si, polycrystalline Si, SiGe, amorphous Si, silicon-on-insulator substrates (SOI), SiGe-on-insulator (SGOI), annealed poly Si, and poly Si line structures. In various embodiments, substrate 50 may be, for example, a layered substrate (e.g. SOI substrate), a bulk substrate, a planar device substrate, etc. The substrate 50 includes a microdevice 20 such as a back end of the line microdevice, front end of the line microdevice, middle of the line microdevice and wiring 22 including one or more wiring layers electrically connected to the microdevice 20. In a particular embodiment, microdevice 20 is a field effect transistor (FET), such as a fin FET, pFET, nFET, etc. The wiring 22 is electrically connected to the contact structure by wiring contact 24. The wiring contact 24 and wiring 22 allows for current to be transferred from an external surface of substrate 50 to microdevice 20.

Figure 7:
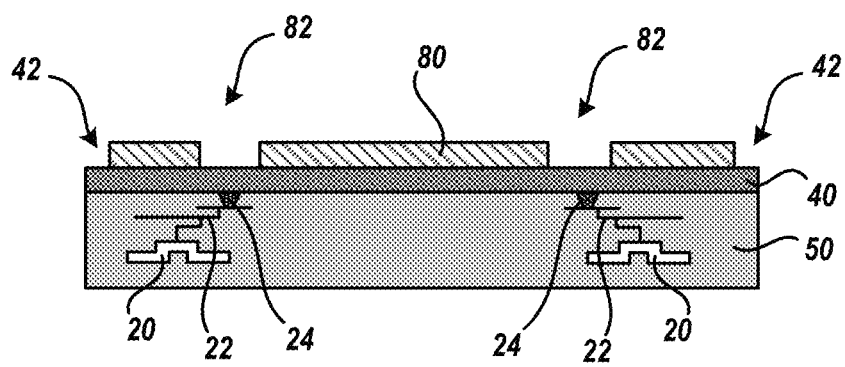
FIG. 7 and FIG. 8 depict cross section views of an IC device at a particular stage of fabrication, according to embodiments of the present invention.

Residual plating portion 40' may be formed by retaining a portion of shorting layer 40, shown for example in FIG. 7, an electrically conductive layer that is formed upon the substrate 50 and utilized to plate electrically conductive materials.

FIG. 6 depicts a cross section view of a portion of an IC die carrier 150, in accordance with various embodiments of the present invention. The carrier 150 includes a laminate 101, wiring 122, wiring contact 124. The IC die carrier 150 also includes a contact structure 180 including a contact 170, and solder bump 60. Laminate 101 may be an organic carrier formed of multiple laminate layers or a ceramic carrier, as are known in the art. The contact structures, wiring 124, etc. provide electrical paths from the upper surface of carrier 150 to the opposing side of carrier 150. Contact 170 may be formed by forming a seed layer upon the laminate 101, forming a mask, such as a photoresist, upon the laminate 101 and seed layer, patterning the mask to form contact trenches, and plating an electrically conductive material consuming the seed layer within the contact trenches. Solder bump 60 allows for the electrical connection of a semiconductor die 10 to a particular side of laminate 101 and/or allows for the electrical connection of the laminate 101 to an external electrical device. The solder bump 60 may be plated upon the contact 160 within the contact trenches, placed, screened, etc. upon plate 170. Residual mask and residual seed layer may be subsequently removed.

Contact 100 may be formed directly upon substrate 50 by, for example, utilizing a conductive seed layer directly upon substrate 50 which may be consumed in the formation of base 102 directly upon the substrate 50, similar to the formation of the contact structure 180 of FIG. 6. Likewise, contact structure 180 may be fabricated similar to contact 100 shown in FIG. 5 (i.e. utilizing a shorting layer such that a residual shorting layer portion is then included in structure 180).

FIG. 7 depicts a cross section view of an IC device, such as wafer 5, semiconductor die 10, etc. at a particular stage of fabrication. At the present stage of fabrication, shorting layer 40 is formed upon substrate 50 and a patterned mask 80 is formed upon the shorting layer 40.

Shorting layer 40 may be formed using a sputtering technique or other known deposition technique. In embodiments, the shorting layer 40 may be, for example, copper or other conductive metal such as, for example, nickel, nickel alloys, copper alloys, etc. The shorting layer 40 may be multilayered and further include a barrier layer which may be, for example, Titanium, Titanium Tungsten, or Titanium Tungsten Chrome. The shorting layer 40 may be about 0.45 microns thick; although other dimensions are also contemplated by the present invention such as, for example, a range of about between 0.1 to 0.6 microns. In certain embodiments, shorting layer 40 is utilized as a shorting layer where a plating tool electrically contacts wafer 5 to enable plating of contact 100, solder 60, etc.

Mask 80 may be a known mask material such as a photoresist that may be formed upon the shorting layer 40 and patterned to form contact trenches 82. Mask 80 may be applied as a liquid upon shorting layer 40 that may dry and is patterned generally forming trenches 82 within the mask 80 that expose underlying portions of the shorting layer 40. For example, when mask 80 is a photoresist, a liquid photoresist may be formed by precision spraying, roller coating, dip coating, spin coating, etc. Exemplary liquid photoresists can be either positive tone resists such as TCIR-ZR8800 PB manufactured by Tokyo Ohka Kogyo America, Inc. or negative tone resists such as JSR THB 126N manufactured by JSR Micro, Inc., Poly(methyl methacrylate) (PMMA), Poly(methyl glutarimide) (PMGI), Phenol formaldehyde resin (DNQ/Novolac), etc. Mask 80 may also be a semi-solid film coated, laminated, or otherwise formed upon shorting layer 40. For example, mask 80 may be a dry photoresist such as Asahi CX8040, Asahi CXA240, Riston photoresists, WBR photoresists.

Mask 80 is of sufficient thickness to form base 102, contact structures 180, etc. As such, mask 80 may be chosen to be of a material and a thickness to satisfy such requirements. For example, mask 80 may have a thickness ranging from about 5 um to about 500 um, although a thickness less than 5 um and greater than 500 um have been contemplated. In one embodiment, mask 80 may be about 75 um to 175 um thick. Perimeter portions of shorting layer 40 are left uncovered by mask 80 forming electrically conductive perimeter region 42.

A pattern may be formed in the mask 80 by removing portions of the mask 80. For example, when mask 80 is a photoresist, portions of the mask 80 may be exposed to radiation such as deep ultraviolet light or electron beams. Once the patterning of mask 80 is completed, portions of the mask 80 may be retained and portions of mask 80 may be etched away by an etchant that removes mask 80 material. The portions of mask 80 that are etched away reveal the underlying shorting layer 40. In various embodiments, the portions of mask 80 that are etched away form trenches 82 in which electrically conductive materials may be plated within.

Figure 8:
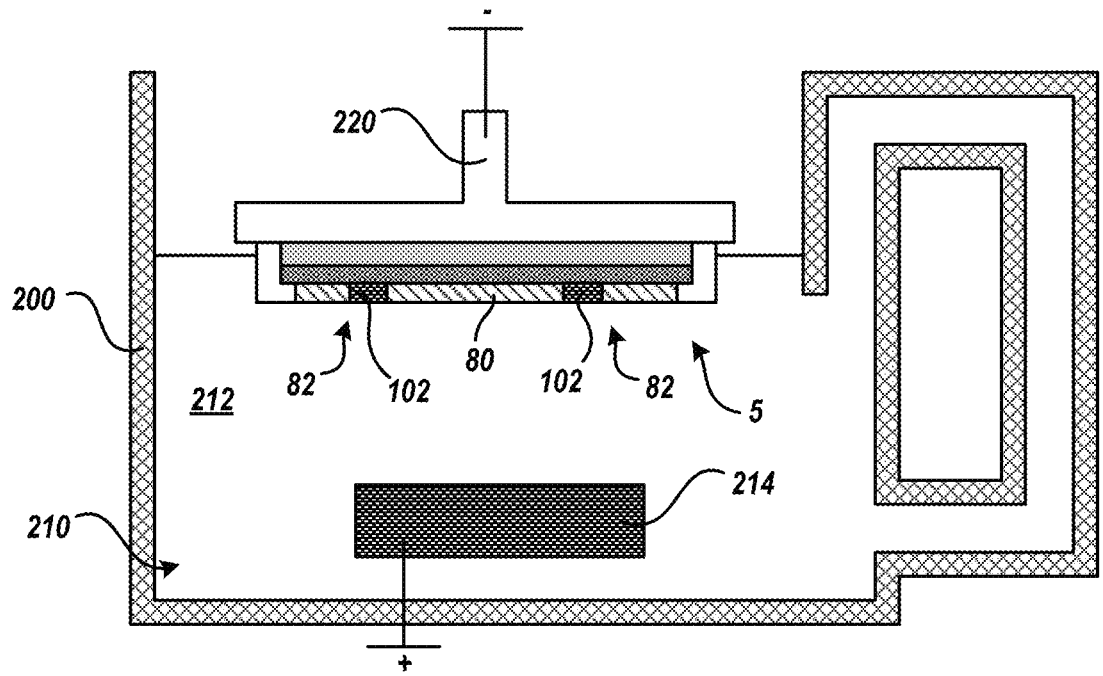

Referring now to FIG. 8, which depicts a plating tool 200 and wafer 5 at a stage of fabrication in which base 102 is formed upon shorting layer 40. Plating, electroplating, electrodeposition, etc. is a process in which wafer 5 is placed in a reservoir 210 which contains a plating solution 212 (e.g. plating bath, etc.). The wafer 5 may be attached to a fixture 220 that accepts wafer 5, wraps around wafer 5, and contacts electrically conductive perimeter region 42 such that only the shorting layer 40 within trenches 82 are exposed to the plating solution 212. An electrical circuit is created when a negative terminal of a power supply contacts electrically conductive perimeter region 42 of wafer 5 so as to form a cathode and a positive terminal of the power supply is connected to plating material 214 in the tool 200 so as to form an anode.

Typically, plating tools or the power supplies themselves have the capability of controlling pulse plating parameters. For example, in a pulse plate operation, the plating tool may control the amount of time the current is off and the amount of time the current is on which may be set upon the plating tool via a user interface. The pulse plating operation may be controlled to a constant current or a constant potential pulse. In the constant current mode, the tops of the current wave form are kept flat by allowing the potential to vary during the pulse on-time. In the constant potential mode, the tops of the potential pulses are kept flat by varying the current during the pulse on-time. Generally, pulse plating is utilized to produce fine grain flat plated material. However, in embodiments described herein, pulse plating is utilized to selective plate a particular specie while suppressing the plating of another specie.

The plating material 214 may be a stabilized metal specie in the plating solution 212. During the plating process, when an electrical current is passed through the circuit, this metal specie is dissolved in the solution 212 which take-up electrons forming base 102 upon the exposed shorting layer 40 within trenches 82. In a particular embodiment, the plating material 214 may be, for example, Copper (Cu). In an exemplary Cu plating process, in a sulfate solution, Copper is oxidized at the anode to $Cu^{2+}$ by losing two electrons. The $Cu^{2+}$ associates with $SO_4^{2-}$ in the solution to form copper sulfate. At the cathode, the $Cu^{2+}$ is reduced to metallic Cu by gaining two electrons.

Figure 9:
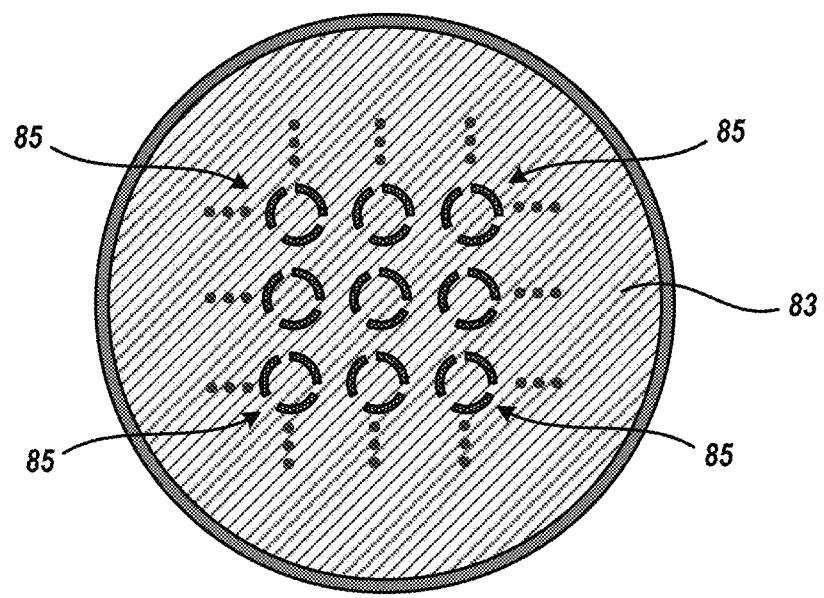
FIG. 9 depicts a normal view of an IC device at a particular stage of fabrication, according to embodiments of the present invention.

Referring now to FIG. 9, which depicts an IC device at a particular stage of fabrication in which a mask 83 is formed upon mask 80 and upon external circuitry facing surface 103 of base 102 and patterned to form fin trenches 85.

Mask 83 may be a known mask material such as a photoresist that may be formed upon mask 80 and upon external circuitry facing surface 103 of base 102 and patterned to form fin trenches 85. Mask 83 may be applied as a liquid that may dry and is patterned generally forming trenches 85 within the mask 83 that expose underlying portions of base 102. For example, when mask 83 is a photoresist, a liquid photoresist may be formed by precision spraying, roller coating, dip coating, spin coating, etc. Mask 83 may also be a semi-solid film coated, laminated, or otherwise formed upon mask 80 and upon external circuitry facing surface 103 of base 102.

Mask 83 is of sufficient thickness to form fins 110. As such, mask 83 may be chosen to be of a material and a thickness to satisfy such requirements. For example, mask 80 may have a thickness ranging from about 5 um to about 500 um, although a thickness less than 5 um and greater than 500 um have been contemplated. In one embodiment, mask 83 may be about 75 um to 175 um thick. Conductive perimeter region 42 of shorting layer 40 may be left uncovered by mask 83.

A pattern may be formed in the mask 83 in the general footprint shape of the desired fins 110 by removing portions of the mask 83. For example, when mask 83 is a photoresist, portions of the mask 83 may be exposed to radiation such as deep ultraviolet light or electron beams. Once the patterning of mask 83 is completed, portions of the mask 83 may be retained and portions of mask 83 may be etched away by an etchant that removes mask 83 material. The portions of mask 83 that are etched away reveal the underlying external circuitry facing surface 103 of base 102. In various embodiments, the portions of mask 83 that are etched form fin trenches 83 in which electrically conductive materials of the fin 110 may be plated within.

Figure 10A:
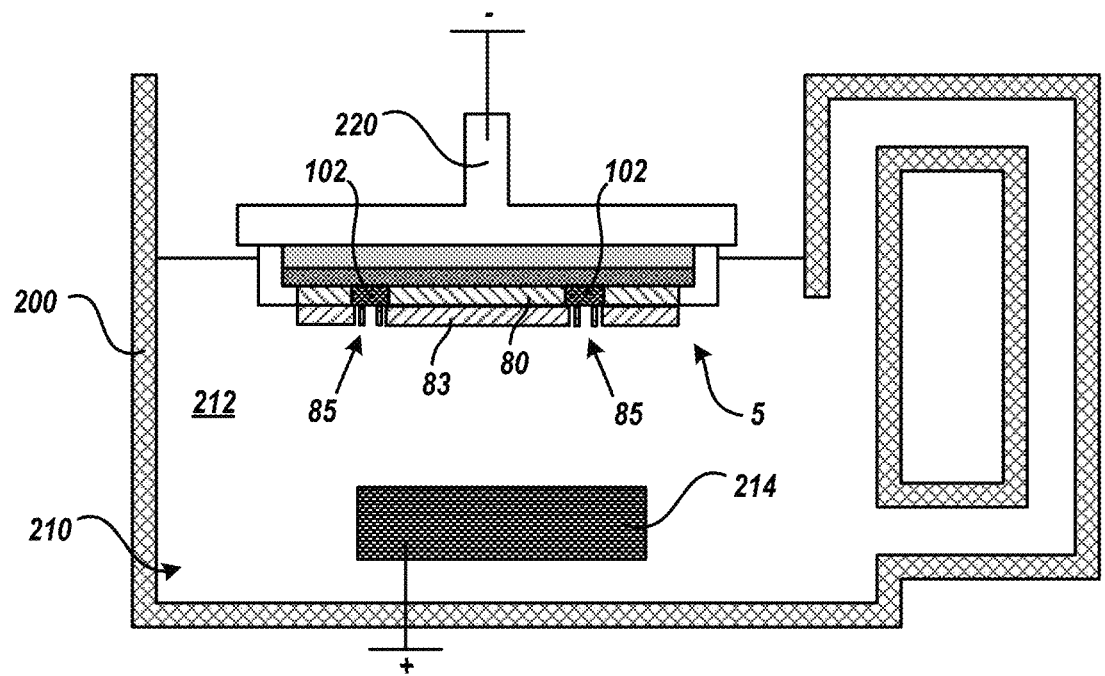
FIG. 10A depicts a cross section view of an IC device at a particular stage of fabrication, according to embodiments of the present invention.

Referring now to FIG. 10A, which depicts plating tool 200 and wafer 5 at a stage of fabrication in which layer 50 is formed upon external circuitry facing surface 103 of base 102. An electrical circuit is created when a negative terminal of a power supply contacts electrically conductive perimeter region 42 of wafer 5 so as to form a cathode and a positive terminal of the power supply is connected to plating material 214 so as to form an anode.

The plating material 214 may be a stabilized metal specie in the plating solution 212. During the plating process, when an electrical current is passed through the circuit, this metal specie is dissolved in the solution 212 which take-up electrons forming layer 50 is formed upon external circuitry facing surface 103 of base 102 within trenches 85. In a particular embodiment, the plating material 214 may be, for example, Copper (Cu). and the plating solution 212 may be a sulfate solution. In some instances, the plating of plating of layer 50 is formed upon external circuitry facing surface 103 of base 102 within trenches 85 may be time such that layer 50 partially fills trenches 85 to allow for additional layers 52, 54, etc. to subsequently be formed within trenches 85. In some instances, the plating of plating of layer 50 is formed upon external circuitry facing surface 103 of base 102 within trenches 85 fully fills trenches 85.

Figure 10B:
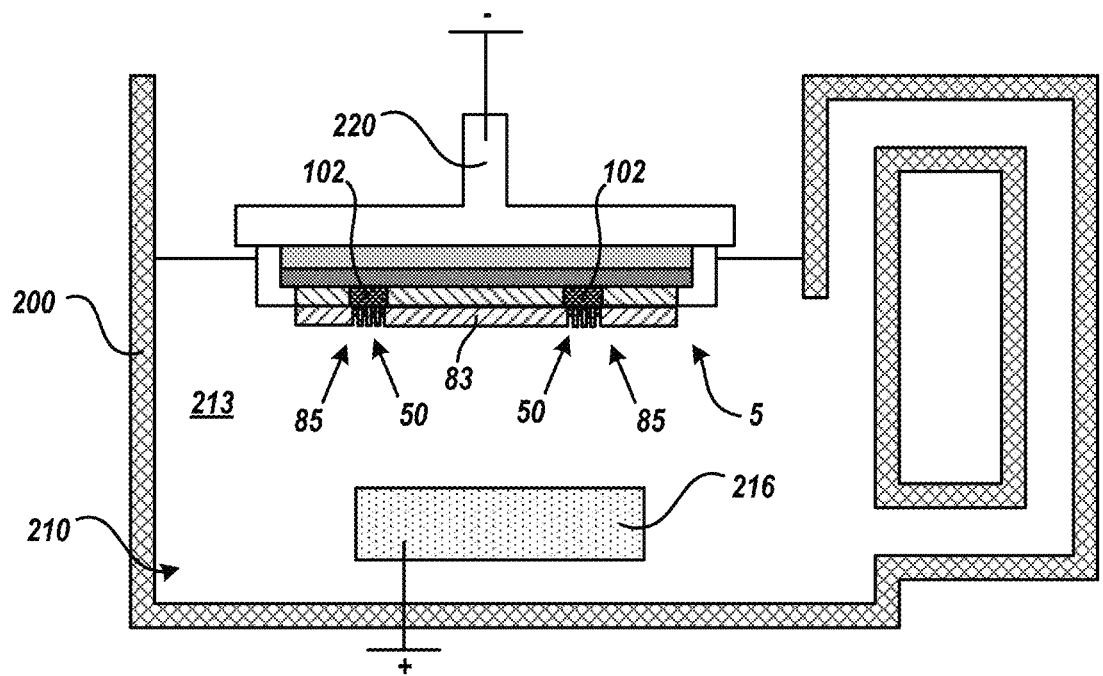
FIG. 10B depicts a cross section view of an IC device at a particular stage of fabrication, according to embodiments of the present invention.

Referring now to FIG. 10B, which depicts plating tool 200 and wafer 5 at a stage of fabrication in which layer 52 is formed upon layer 50 within trenches 85. An electrical circuit is created when a negative terminal of a power supply contacts electrically conductive perimeter region 42 of wafer 5 so as to form a cathode and a positive terminal of the power supply is connected to plating material 216 so as to form an anode.

During the plating process, when an electrical current is passed through the circuit, this metal specie is dissolved in the solution 213 which take-up electrons forming layer 52 upon layer 50 within trenches 85. In a particular embodiment, the plating material 216 may be, for example, Nickel and the plating solution 213 may be a sulfate solution. In some instances, the plating of plating of layer 52 upon layer 50 may be time such that layer 52 partially fills trenches 85 to allow for additional layers 54, etc. to subsequently be formed within trenches 85. In some instances, the plating of plating of layer 52 is formed upon layer 50 within trenches 85 fully fills trenches 85.

Figure 11:
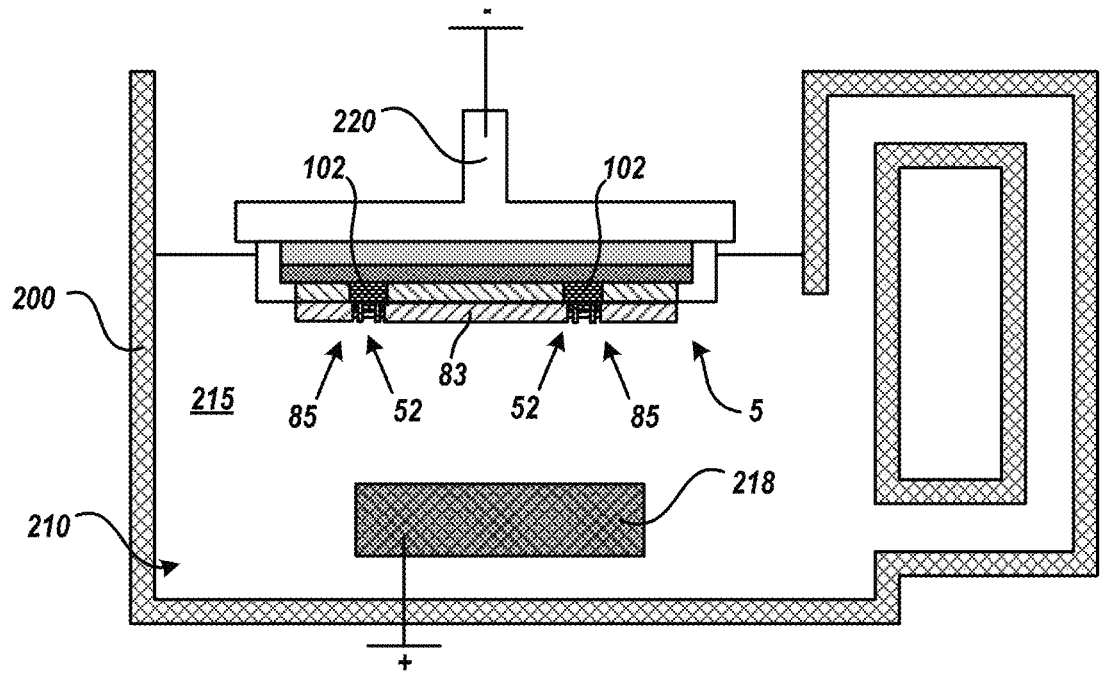
FIG. 11 depicts a cross section view of an IC device at a particular stage of fabrication, according to embodiments of the present invention.
Figure 12:
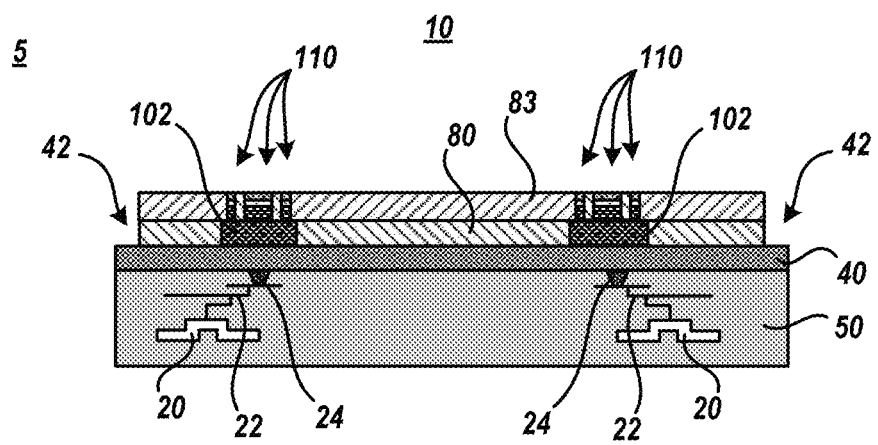
FIG. 12 and FIG. 13 depict cross section views of an IC device at particular stages of fabrication, according to embodiments of the present invention.

Referring now to FIG. 11 and FIG. 12, which depicts plating tool 200 and wafer 5 at a stage of fabrication in which layer 54 is formed upon layer 52 within trenches 85, thereby forming fins 110 upon base 102 of contact 100. An electrical circuit is created when a negative terminal of a power supply contacts electrically conductive perimeter region 42 of wafer 5 so as to form a cathode and a positive terminal of the power supply is connected to plating material 218 so as to form an anode.

During the plating process, when an electrical current is passed through the circuit, this metal specie is dissolved in the solution 215 which take-up electrons forming layer 54 upon layer 52 within trenches 85. In one embodiment, the plating material 218 may be, for example, Copper and the plating solution 215 may be a sulfate solution. In another embodiment, the plating material 218 may be, for example, Gold and the plating solution 215 may be a sulfate or sulfite solution. In some instances, the plating of plating of layer 54 upon layer 52 may be time such that layer 54 partially fills trenches 85 to allow for additional layers to subsequently be formed within trenches 85. In some instances, the plating of plating of layer 54 is formed upon layer 52 within trenches 85 fully fills trenches 85.

Figure 13:
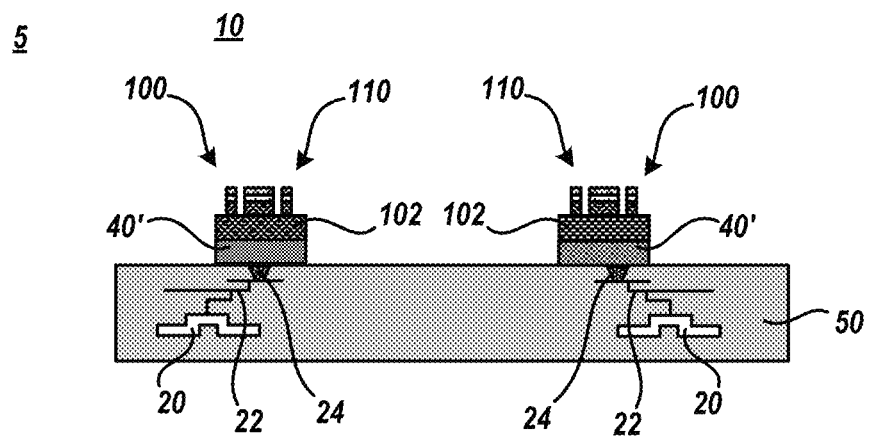

Referring now to FIG. 13, which depicts a cross section of an IC device at particular stages of fabrication where mask 80, mask 83, and residual shorting layer 40 is removed. For example, mask 80, 83 may be removed chemically or by utilizing an oxygen based RIE, laser based ablative photodecomposition (APD), etc. Portions of shorting layer 40 are removed while other portions 40' of the shorting layer are retained. Portions of shorting layer 40 may be removed by, for example, utilizing a wet etch, dry etch, or combination. In other embodiments, portions of shorting layer 40 may be removed by other known processes such as, for example, liquid or gas flux techniques. In certain embodiments, only the portions of shorting layer 40 exterior the base 102 are removed leaving retained portions 40' under base 102.

Upon the removal of portions of shorting layer 40, a contact 110 is formed upon the retained portion 40' of shorting layer. The width/diameter of the base 102 is generally similar to the width of the trench 82 of the mask 80. In certain embodiments, an argon, oxygen, etc. RIE ash may be performed to refresh the retained surfaces of the IC device subsequent to the removal of mask 80, 83 and/or removal of the portions.

Figure 14:
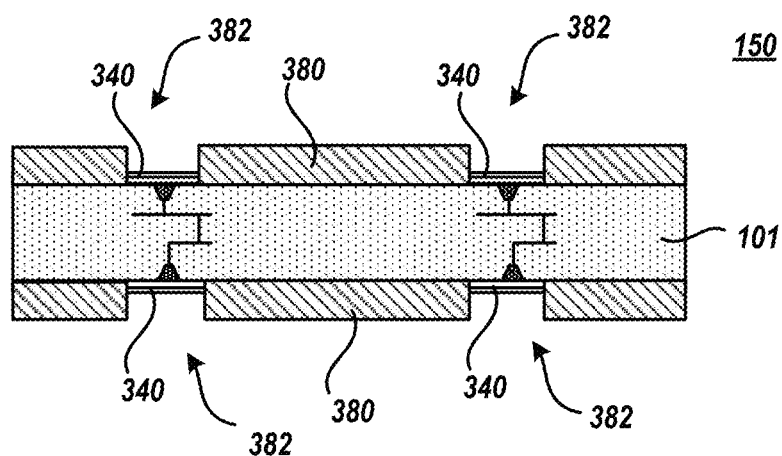
FIG. 14 through FIG. 21 depict cross section views of an IC die carrier at particular stages of fabrication, according to embodiments of the present invention.

FIG. 14 depicts a cross section view of an IC device, such as die carrier 150, etc. at a particular stage of fabrication. At the present stage of fabrication, seed layer 340 is formed upon laminate 101, a mask 380 is formed upon the laminate 101 around seed layer 340, and mask 380 is patterned.

Seed layer 340 may be formed using a sputtering technique or other known deposition technique. In embodiments, the seed layer 340 may be, for example, copper or other conductive metal that which may promote plating of the desired material of base 102 and/or contact 170. The seed layer 340 may be about 0.45 microns thick; although other dimensions are also contemplated by the present invention such as, for example, a range of about between 0.1 to 0.6 microns. In certain embodiments, seed layer 340 is utilized as a conductive layer to enable plating of base 102, contact 170, etc.

Mask 380 may be a known mask material such as a photoresist that may be formed upon laminate 101 and around the seed layer 340 and patterned to form contact trenches 382. Mask 380 may be applied as a liquid that may dry and is patterned generally forming trenches 382 within the mask 380 that expose underlying portions of the laminate 101 and seed layer 340. For example, when mask 380 is a photoresist, a liquid photoresist may be formed by precision spraying, roller coating, dip coating, spin coating, etc. Mask 380 may also be a semi-solid film coated, laminated, or otherwise formed upon laminate 101 around seed layer 340.

Mask 380 is of sufficient thickness to form base 102, contact 170, etc. As such, mask 380 may be chosen to be of a material and a thickness to satisfy such requirements. For example, mask 380 may have a thickness ranging from about 5 um to about 500 um, although a thickness less than 5 um and greater than 500 um have been contemplated. In one embodiment, mask 380 may be about 75 um to 175 um thick.

A pattern may be formed in the mask 380 by removing portions of the mask 380. For example, when mask 380 is a photoresist, portions of the mask 380 may be exposed to radiation such as deep ultraviolet light or electron beams. Once the patterning of mask 380 is completed, portions of the mask 380 may be retained and portions of mask 380 may be etched away by an etchant that removes mask 380 material. The portions of mask 380 that are etched away reveal the underlying laminate 101 and seed layer 340. In various embodiments, the portions of mask 380 that are etched away form trenches 382 in which electrically conductive materials may be plated within.

Figure 15:
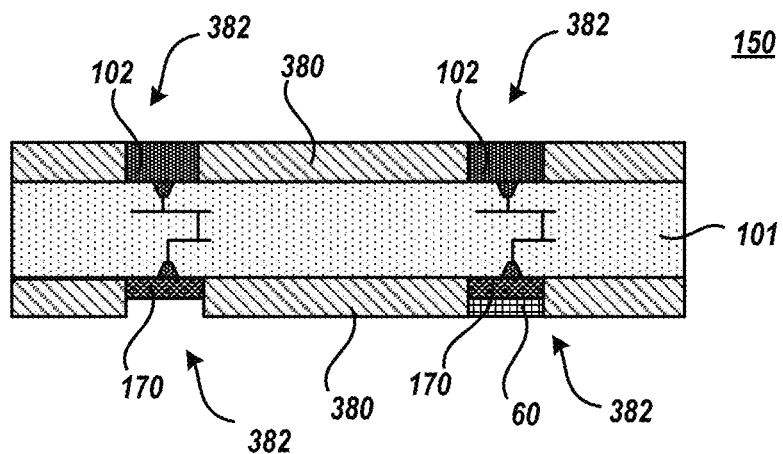

Referring now to FIG. 15, which depicts die carrier 150 at a stage of fabrication in which base 102 and/or contact 170 is formed upon laminate 101 consuming seed layer 340. Base 102 and/or contact 170 may be formed by known deposition techniques, such as plating, or the like. For clarity, base 102 and/or contact 170 may be formed upon one side (e.g., top side) of laminate 101 and subsequently base 102 and/or contact 170 may be formed upon the opposite side of laminate 101.

Plating, electroplating, electrodeposition, etc. is a process in which die carrier 150 is placed in a reservoir which contains a plating solution or bath. The die carrier 150 may be attached to a fixture that accepts die carrier 150, wraps around die carrier 150, and electrically contacts seed layer 340. Seed layer 340 within trenches 282 may be the only portions of seed layer 340 that are exposed to the plating solution. An electrical circuit is created when a negative terminal of a power supply electrically contacts seed layer 340 so as to form a cathode and a positive terminal of the power supply is connected to plating material in the tool so as to form an anode.

The plating material may be a stabilized metal specie in the plating solution. During the plating process, when an electrical current is passed through the circuit, this metal specie is dissolved in the solution which take-up electrons forming base 102 and/or contact 170 that consume seed layer 240 within trenches 82. In an embodiment, the plating material may be, for example, Copper (Cu) and the plating solution may be a sulfate solution.

In some instances, the deposition of base 102 material and/or contact 170 material may be such that base 102 and/or contacts 170 fully fills trenches 382. In other instances, the formation of contacts 170 partially fill trenches 382 to allow for additional materials (e.g., solder 60, etc.) to subsequently be formed within trenches 382.

Figure 16:
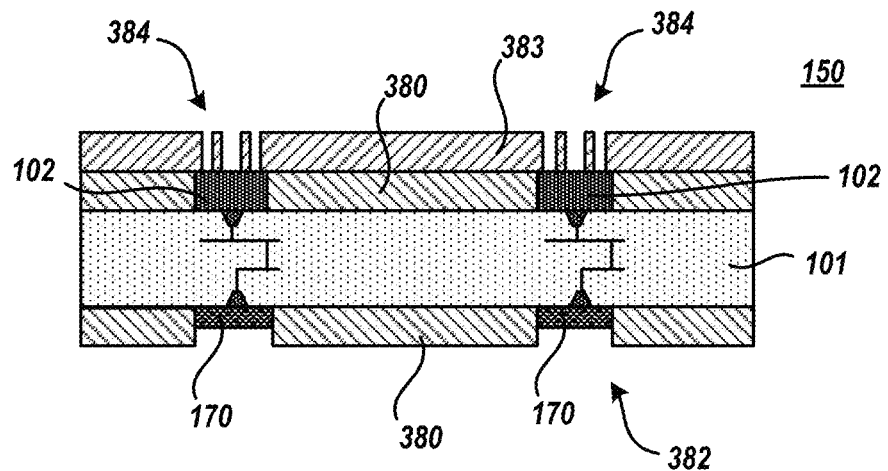

Referring now to FIG. 16, which depicts die carrier 150 at a particular stage of fabrication in which a mask 383 is formed upon mask 380 and upon external circuitry facing surface 103 of base 102 and patterned to form fin trenches 385.

Mask 383 may be a known mask material such as a photoresist that may be formed upon mask 380 and upon external circuitry facing surface 103 of base 102 and patterned to form fin trenches 385. Mask 383 may be applied as a liquid that may dry and is patterned generally forming trenches 385 within the mask 383 that expose underlying portions of base 102. For example, when mask 383 is a photoresist, a liquid photoresist may be formed by precision spraying, roller coating, dip coating, spin coating, etc. Mask 383 may also be a semi-solid film coated, laminated, or otherwise formed upon mask 380 and upon external circuitry facing surface 103 of base 102.

Mask 383 is of sufficient thickness to form fins 110. As such, mask 383 may be chosen to be of a material and a thickness to satisfy such requirements. For example, mask 383 may have a thickness ranging from about 5 um to about 500 um, although a thickness less than 5 um and greater than 500 um have been contemplated. In one embodiment, mask 383 may be about 75 um to 175 um thick.

A pattern may be formed in the mask 383 in the general footprint shape of the desired fins 110 by removing portions of the mask 383. For example, when mask 383 is a photoresist, portions of the mask 383 may be exposed to radiation such as deep ultraviolet light or electron beams. Once the patterning of mask 383 is completed, portions of the mask 383 may be retained and portions of mask 383 may be etched away by an etchant that removes mask 383 material. The portions of mask 383 that are etched away reveal the underlying external circuitry facing surface 103 of base 102. In various embodiments, the portions of mask 383 that are etched form fin trenches 385 in which electrically conductive materials of the fin 110 may be formed within.

Figure 17:
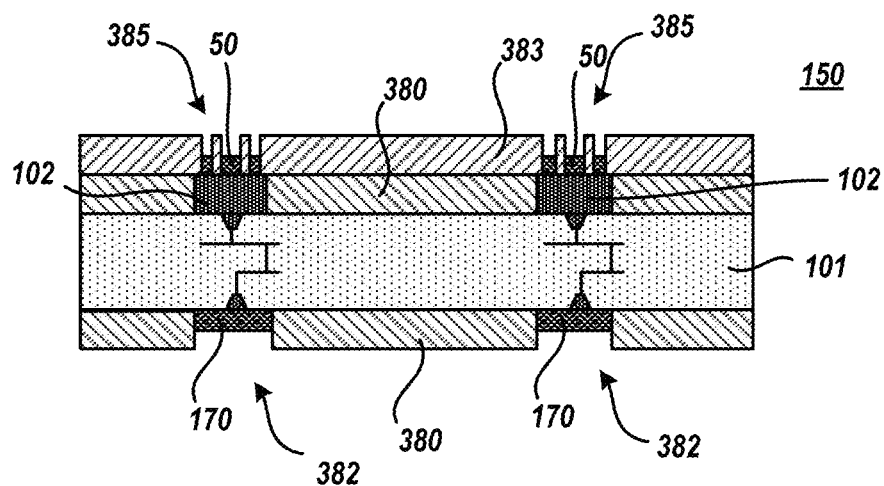

Referring now to FIG. 17, which depicts die carrier 150 at a stage of fabrication in which layer 50 is formed upon external circuitry facing surface 103 of base 102 within fin trenches 385. Layer 50 may be formed upon external circuitry facing surface 103 of base 102 within fin trenches 385 by known deposition techniques. For example, layer 50 may be formed by plating, or the like.

If layer 50 is formed by plating, an electrical circuit may be created when a negative terminal of a power supply is electrically connected with seed layer 340 and/or base 102 so as to form a cathode and a positive terminal of the power supply is connected to plating material so as to form an anode.

The plating material may be a stabilized metal specie in a plating solution. During the plating process, when an electrical current is passed through the circuit, this metal specie is dissolved in the solution which take-up electrons forming layer 50 upon external circuitry facing surface 103 of base 102 within trenches 85. In a particular embodiment, the plating material may be, for example, Copper (Cu). and the plating solution may be a sulfate solution. In some instances, the plating of plating of layer 50 is formed upon external circuitry facing surface 103 of base 102 within trenches 385 may be time such that layer 50 partially fills trenches 385 to allow for additional layers 52, 54, etc. to subsequently be formed within trenches 385. In some instances, the plating of layer 50 is formed upon external circuitry facing surface 103 of base 102 within trenches 385 fully fills trenches 385.

Figure 18:
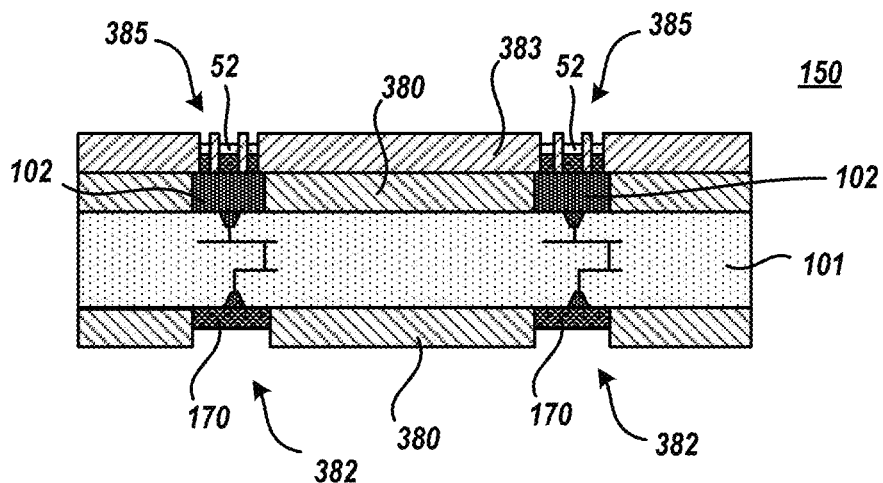

Referring now to FIG. 18, which depicts die carrier 150 at a stage of fabrication in which layer 52 is formed upon layer 50 within trenches 385. Layer 52 may be formed upon layer 50 within fin trenches 385 by known deposition techniques. For example, layer 52 may be formed by plating, or the like.

If layer 52 is formed by plating, an electrical circuit may be created when a negative terminal of a power supply is electrically connected with seed layer 340 and/or base 102 so as to form a cathode and a positive terminal of the power supply is connected to plating material so as to form an anode.

During the plating process, when an electrical current is passed through the circuit, this metal specie is dissolved in the solution which take-up electrons forming layer 52 upon layer 50 within trenches 385. In an embodiment, the plating material may be, for example, Nickel and the plating solution 213 may be a sulfate or sulfamate solution. In some instances, the plating of plating of layer 52 upon layer 50 may be timed such that layer 52 partially fills trenches 385 to allow for additional layers 54, etc. to subsequently be formed within trenches 385. In some instances, the plating of layer 52 is formed upon layer 50 within trenches 385 fully fills trenches 385.

Figure 19:
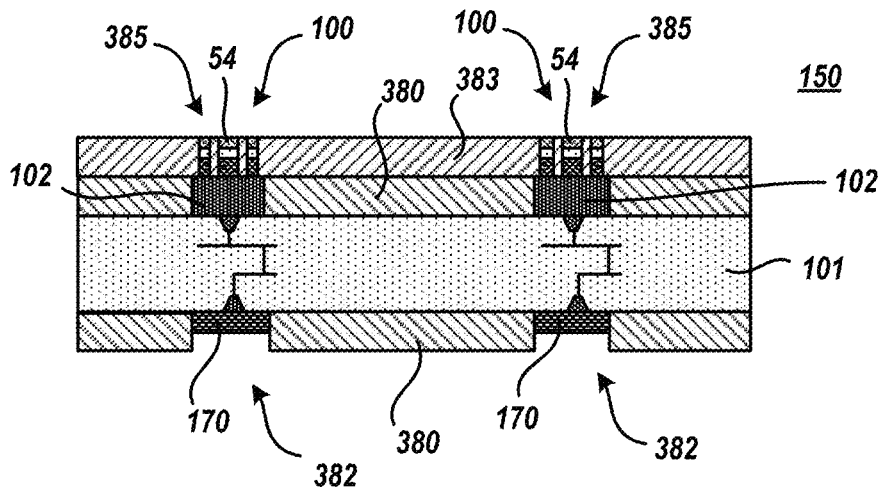

Referring now to FIG. 19, which depicts die carrier 150 at a stage of fabrication in which layer 54 is formed upon layer 52 within trenches 385. Layer 54 may be formed upon layer 52 within fin trenches 385 by known deposition techniques. For example, layer 54 may be formed by plating, or the like.

If layer 54 is formed by plating, an electrical circuit may be created when a negative terminal of a power supply is electrically connected with seed layer 340 and/or base 102 so as to form a cathode and a positive terminal of the power supply is connected to plating material so as to form an anode.

During the plating process, when an electrical current is passed through the circuit, this metal specie is dissolved in the solution which take-up electrons forming layer 54 upon layer 52 within trenches 385. In an embodiment, the plating material may be, for example, Copper and the plating solution 213 may be a sulfate solution. In another embodiment, the plating material may be, for example, Gold and the plating solution 215 may be a sulfate or sulfite solution.

In some instances, the plating of layer 54 upon layer 52 may be timed such that layer 54 partially fills trenches 385 to allow for additional layers to subsequently be formed within trenches 385. In some instances, the plating of layer 54 upon layer 52 within trenches 385 fully fills trenches 385.

Figure 20:
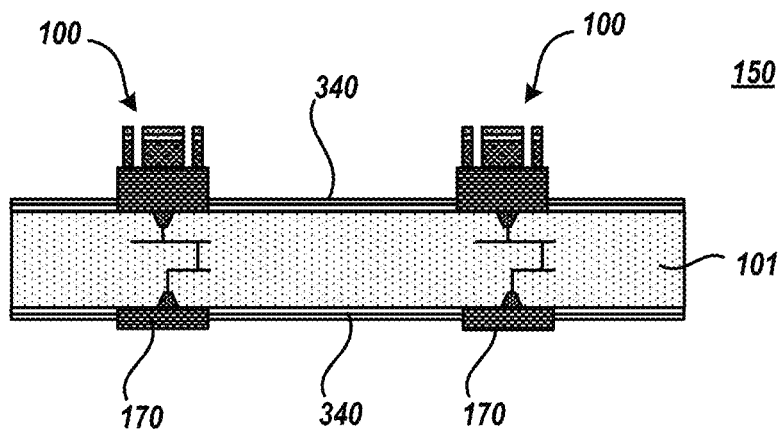
Figure 21:
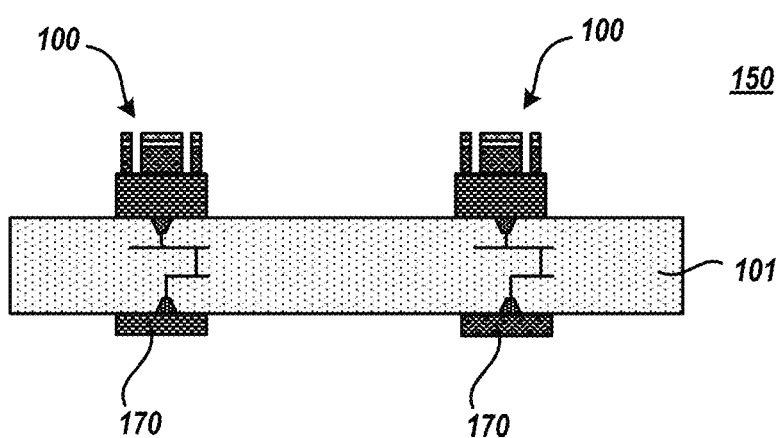

Referring now to FIG. 20 and FIG. 21, which depicts a cross section die carrier 150 at particular stages of fabrication where mask 380, mask 383, and residual seed layer 340 is removed. For example, mask 380, 383 may be removed chemically or by utilizing an oxygen based RIE, laser based ablative photodecomposition (APD), etc. Residual portions of seed layer 340 are removed by, for example, utilizing a wet etch, dry etch, or combination. In other embodiments, residual seed layer 340 may be removed by other known processes such as, for example, liquid or gas flux techniques.

In this manner, a contact 110 is formed upon the laminate 101. Similar techniques utilizing the seed layer may be utilized to fabricate other IC devices, such as wafer 5, die 10, etc. The width/diameter of the base 102 is generally similar to the width of the trench 382 of the mask 380. In certain embodiments, an argon, oxygen, etc. RIE ash may be performed to refresh the retained surfaces of the die carrier 150 subsequent to the removal of mask 380, 383 and/or removal of the seed layer 340.

Figure 22:
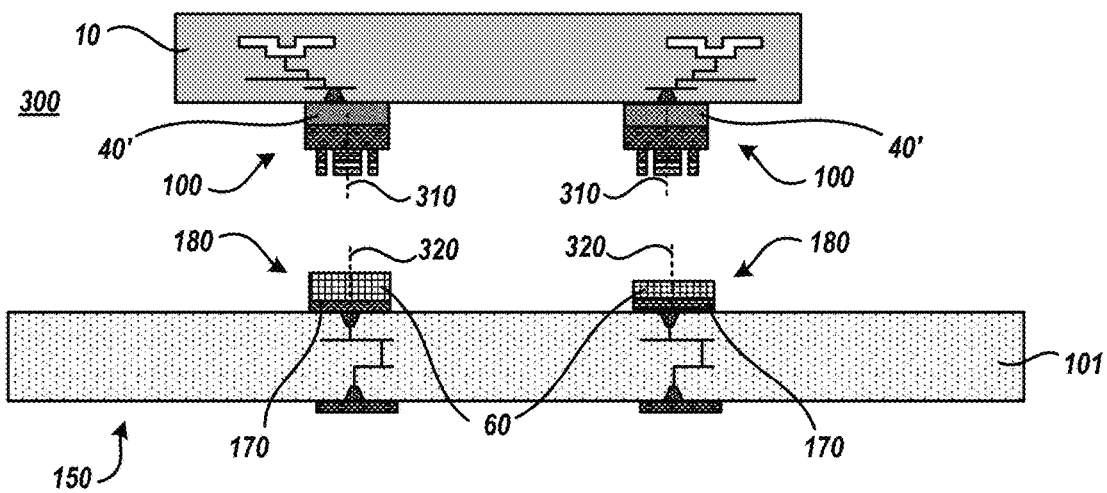
FIG. 22 depicts a cross section view of an IC die package at a particular stage of fabrication, according to embodiments of the present invention.

FIG. 22 depicts a cross section view of an IC die package 300 at a fabrication stage of where die 10 is aligned with die carrier 150, according to embodiments of the present invention. Die 10 may be aligned with die carrier 150 by aligning one or more center axis 310 of contact 100 with an associated center axis 320 of contact 170 of carrier 150. In the depicted embodiment, contact 100 is located upon die 10 and contact 170 is located on carrier 150.

Figure 23:
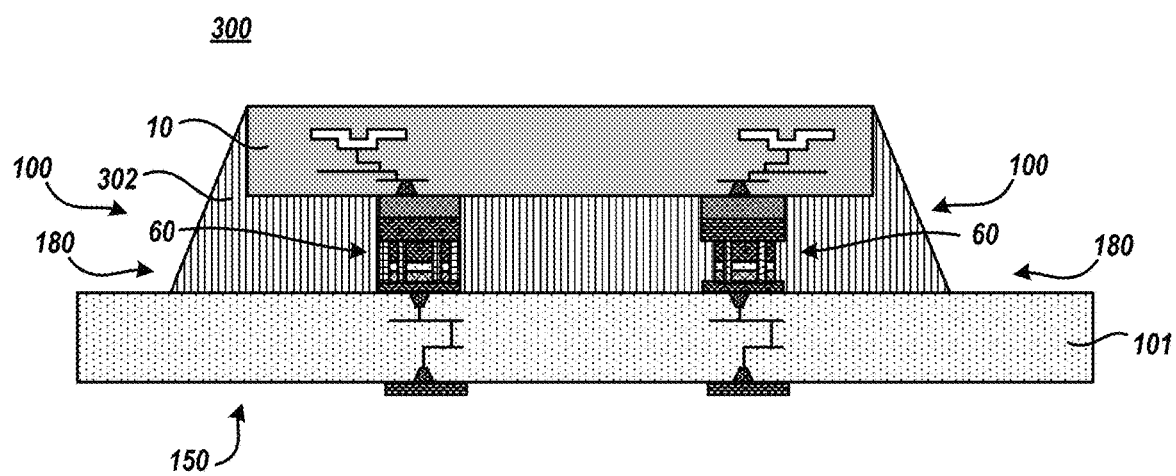
FIG. 23 depicts a cross section view of an IC die package, according to embodiments of the present invention.

FIG. 23 depicts a cross section view of IC die package 300 at a fabrication stage of where die 10 is connected to die carrier 150, according to embodiments of the present invention. The aligned die 10 is lowered such that contacts 100 rest upon contact stack 180. Solder 60 may be reflowed to connect contact 100 with contact 170. Solder 60 may be draw toward the center axis 310 of contact 100 within inner void 120, as is depicted in the right contact 100 of FIG. 23. Subsequently underfill 302 may be applied upon laminate 101 around the perimeter of die 10. Capillary action may draw the underfill 203 under die 10 between die 10 and laminate 101. Underfill may electrically isolate neighboring contact structures. The fins 110 of contact 100 may more efficiently drive electrical current from die 10 into carrier 150, or vice versa, relative to a flat or non-finned contact.

Figure 24:
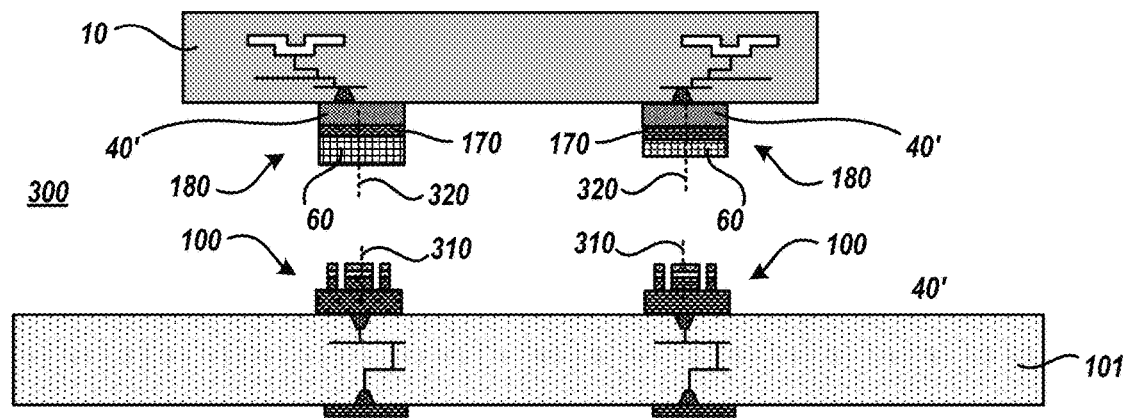
FIG. 24 depicts a cross section view of an IC die package at a particular stage of fabrication, according to embodiments of the present invention.

FIG. 24 depicts a cross section view of an IC die package 300 at a fabrication stage of where die 10 is aligned with die carrier 150, according to embodiments of the present invention. Die 10 may be aligned with die carrier 150 by aligning one or more center axis 310 of contact 100 with an associated center axis 320 of contact 170 of carrier 150. In the depicted embodiment, contact 100 is located upon die carrier 150 and contact 170 is located on die 10.

Figure 25:
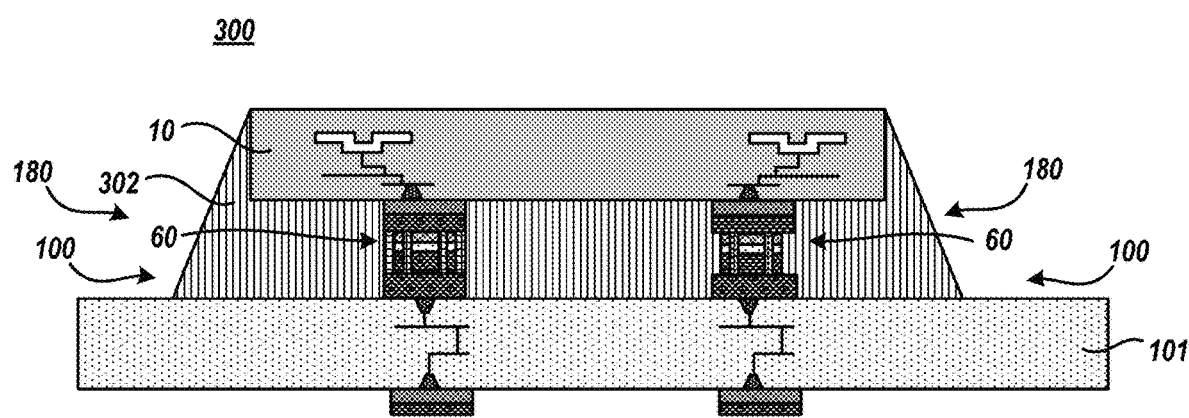
FIG. 25 depicts a cross section view of an IC die package, according to embodiments of the present invention.

FIG. 25 depicts a cross section view of IC die package 300 at a fabrication stage of where die 10 is connected to die carrier 150, according to embodiments of the present invention. The aligned die 10 is lowered such contact stack 180 rests upon contact 100. Solder 60 may be reflowed to connect contact 170 with contact 100. Solder 60 may be draw toward the center axis 310 of contact 100 within inner void 120, as is depicted in the right contact 100 of FIG. 25. Subsequently underfill 302 may be applied upon laminate 101 around the perimeter of die 10. Capillary action may draw the underfill 203 under die 10 between die 10 and laminate 101. Underfill may electrically isolate neighboring contact structures. The fins 110 of contact 100 may more efficiently drive electrical current from die 10 into carrier 150, or vice versa, relative to a flat or non-finned contact.

Figure 26:
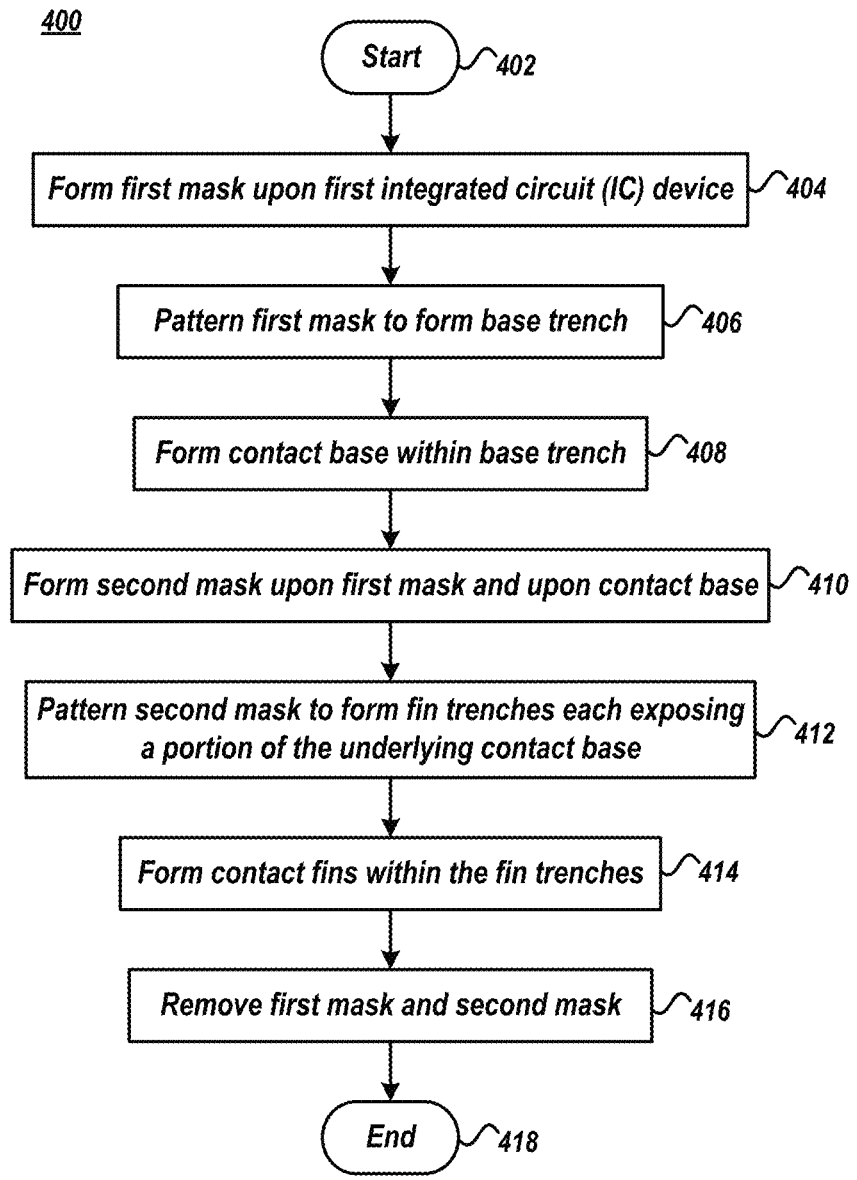
FIG. 26 depicts a method of fabrication a finned contact upon an IC device, according to embodiments of the present invention.
Figure 27:
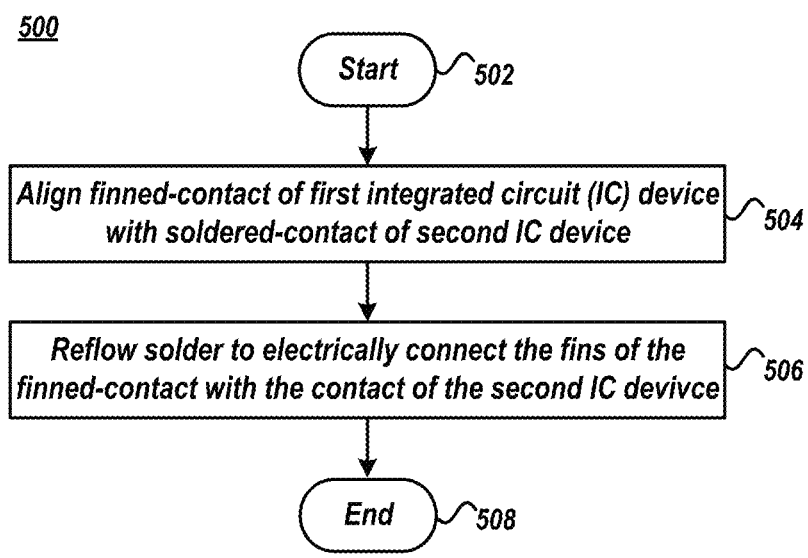
FIG. 27 depicts a method of fabrication a IC die package that includes an IC device with a finned contact, according to embodiments of the present invention.

FIG. 26 depicts a method 400 of fabrication a finned contact 100 upon an IC device, according to embodiments of the present invention. Method 400 may be utilized to fabricate a wafer 5, die 10, die carrier 150, or the like that includes a finned contact 100. Method 400 begins at block 402 and continues with forming first mask upon the IC device (block 404). For example, mask 80, 380, or the like is formed upon the IC device. The mask may be formed upon a shorting layer, such as shorting layer 40 or upon the IC device and around seed layer 340, or the like.

Method 400 may continue with forming a base trench within the first mask (block 406). For example, mask 80, 380, or the like is patterned such that a portion of the mask is removed to form base trench 82, 382, or the like. The base trench may expose the underlying seed layer, shorting layer, or the like.

Method 400 may continue with forming a base of the contact within the base trench (block 408). For example, base 102 may be formed by plating an electrically conductive material, metal, e.g., Copper, or the like within base trench 82, 382. Alternatively, base 102 may be formed by depositing metal or other electrically conductive material within base trench 82, 382, or the like, by other known deposition techniques.

Method 400 may continue with forming a second mask upon the first mask and upon an external circuitry facing surface of the base (block 410). For example, a mask 83, 383 may be formed upon mask 80, 380, respectively, and upon the external circuitry facing surface 103 of base 102.

Method 400 may continue with forming fin trenches within the second mask with each fin trench exposing a portion of the external circuitry facing surface of the base (block 412). For example, mask 85, 385, or the like is patterned with mask 80, 380, respectively, such that a portion of the mask is removed to form fin trenches 85, 385, or the like that expose external circuitry facing surface 103 of the base 102.

Method 400 may continue with forming fins upon the base within the fin trenches (block 414). For example, layer 50 material is formed within each fin trench 85, 385 upon external circuitry facing surface 103 of the base 102. Layer 50 may fully fill or partially fill the fin trench. If layer 50 partially fills the fin trench, layer 52 material may be formed upon layer 50. Layer 52 may fully fill or partially fill the fin trench. If layer 52 partially fills the fin trench, layer 54 material may be formed upon layer 52. Layer 54 may fully fill or partially fill the fin trench.

Method 400 may continue with removing the first mask and second mask from the IC device (block 416). For example, mask 80, 380, 83, 383 are etched from the IC device. Residual shorting layer 40 material and/or seed layer 340 that is not integral to or consumed by the fabrication of the formed contact 100 may also be removed from the IC device. Method 400 may end at block 418.

FIG. 26 depicts a method 500 of fabrication an IC die package that includes an IC device with a finned contact, according to embodiments of the present invention. Method 400 may be utilized to fabricate an IC package 300, or the like that includes an IC device, such as die 10, die carrier 150, or the like that includes a finned contact 100.

Method 500 begins at block 502 and continues with aligning the finned contact 100 of a first IC device with a contact structure 180 that includes a solder 60 interconnect of a second IC device (block 504). For example, the first IC device may be aligned with the second IC device by aligning one or more center axis 310 of contact(s) 100 with an associated center axis 320 of contact 170 of the contact structure 180.

Method 500 may continue with reflowing solder 60 of the contact stack 180 of the second IC device to connect at least the fins 110 or fins 110 and base 102 of the contact 100 of the first IC device with the contact 170 (block 506). For example, the aligned first IC device is lowered such contact 100 rests upon contact stack 180. Solder 60 may be reflowed to connect contact 170 with contact 100. Solder 60 may be draw toward the center axis 310 of contact 100 within inner void 120. Subsequently underfill 302 may be applied and capillary action may draw the underfill 203 between the IC devices. Method end at block 508.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the order of the fabrication stages listed in depicted blocks may occur out of turn relative to the order indicated in the Figures, may be repeated, and/or may be omitted partially or entirely. The terminology used herein was chosen to best explain the principles of the embodiment, the practical application or technical improvement over technologies found in the marketplace, or to enable others of ordinary skill in the art to understand the embodiments disclosed herein.

References herein to terms such as "vertical", "horizontal", and the like, are made by way of example, and not by way of limitation, to establish a frame of reference. The term "horizontal" as used herein is defined as a plane parallel to the conventional plane or upper surface of the carrier 101, regardless of the actual spatial orientation of the carrier 101. The term "vertical" refers to a direction perpendicular to the horizontal, as just defined. Terms, such as "on", "above", "below", "side" (as in "sidewall"), "higher", "lower", "over", "top", "under", "beneath", and the like, are defined with respect to the horizontal plane. It is understood that various other frames of reference may be employed for describing the present invention without departing from the spirit and scope of the present invention.

What is claimed is:

1. An integrated circuit (IC) device comprising:
   an electrically conductive contact base comprising an external circuitry facing base surface, a base center, and one or more base sidewalls concentric with the base center;
   a plurality of fins that extend from the external circuitry facing base surface and that are inset from at least one of the base sidewalls, each fin comprising an inner fin wall that faces and is concentric with the base center and is parallel with at least one of the base sidewalls, an outer fin wall that is concentric with the base center and faces at least one of the base sidewalls, and an external circuitry facing fin surface between the inner fin wall(s) and the outer fin wall(s); and
   an interior void internal to the inner fin wall(s) of each fin from the external circuitry facing base surface to the external circuitry facing fin surfaces of each fin.

2. The IC device of claim 1, wherein the inner fin wall is parallel with the outer fin wall of the same fin.

3. The IC device of claim 1, wherein neighboring fins are separated by a separation from the external circuitry facing base surface to the external circuitry facing fin surfaces of the neighboring fins.

4. The IC device of claim 1, wherein each fin further comprises multiple layers of electrically conductive material.

5. The IC device of claim 1, wherein the base is formed from a first metal, wherein each fin further comprises a first layer directly upon the external circuitry facing base surface, and wherein the first layer is formed from the first metal.

6. The IC device of claim 5, wherein each fin further comprises a second layer directly upon the first layer, and wherein the second layer is formed from a second metal that is a different elemental metal relative to the first metal.

7. The IC device of claim 6, wherein each fin further comprises a third layer directly upon the second layer, and wherein the third layer is formed from the first metal.

8. The IC device of claim 6, wherein each fin further comprises a third layer directly upon the second layer, and wherein the third layer is formed from a third metal that is a different elemental metal relative to the first metal and to the second metal.

9. An integrated circuit (IC) die package comprising:
   a finned contact comprising:
      an electrically conductive contact base comprising an external circuitry facing base surface, a base center, and one or more base sidewalls concentric with the base center;
      a plurality of fins that extend from the external circuitry facing base surface and that are inset from at least one of the base sidewalls, each fin comprising an inner fin wall that faces and is concentric with the base center and is parallel with at least one of the base sidewalls, an outer fin wall that is concentric with the base center and faces at least one of the base sidewalls, and an external circuitry facing fin surface between the inner fin wall(s) and the outer fin wall(s); and an interior void internal to the inner fin wall(s) of each fin from the external circuitry facing base surface to the external circuitry facing fin surfaces of each fin;
an external circuitry contact; and
solder within the interior void that connects the finned contact with the external circuitry contact.

10. The IC die package of claim 9, wherein the finned contact is comprised within an IC die and the external circuitry contact is comprised within an IC die carrier.

11. The IC die package of claim 9, wherein the finned contact is comprised within an IC die carrier and the external circuitry contact is comprised within an IC die.

12. The IC die package of claim 9, wherein the inner fin wall is parallel with the outer fin wall of the same fin.

13. The IC die package of claim 9, wherein neighboring fins are separated by a separation from the external circuitry facing base surface to the external circuitry facing fin surfaces of the neighboring fins.

14. The IC die package of claim 9, wherein each fin further comprises multiple layers of electrically conductive material.

15. The IC die package of claim 9, wherein the base is formed from a first metal, wherein each fin further comprises a first layer directly upon the external circuitry facing base surface, and wherein the first layer is formed from the first metal.

16. The IC die package of claim 15, wherein each fin further comprises a second layer directly upon the first layer, and wherein the second layer is formed from a second metal that is a different elemental metal relative to the first metal.

17. The IC device of claim 16, wherein each fin further comprises a third layer directly upon the second layer, and wherein the third layer is formed from the first metal.

18. The IC device of claim 16, wherein each fin further comprises a third layer directly upon the second layer, and wherein the third layer is formed from a third metal that is a different elemental metal relative to the first metal and to the second metal.

19. A finned contact fabrication method comprising:
forming a contact base within a contact base trench within a first mask upon an IC device surface;
forming a second mask upon the contact base and upon the first mask;
forming a plurality of fin trenches within the second mask exposing portions of the contact base; and
forming a fin upon an exposed portion of the contact base within each of the plurality of fin trenches.

20. The fabrication method of claim 19, wherein the contact base comprises an external circuitry facing base surface and one or more base sidewalls; wherein each fin extends from the external circuitry facing base surface, wherein each fin is inset from at least one of the base sidewalls, wherein each fin comprises an inner fin wall(s) that face a center of the base and that are concentric with at least one of the base sidewalls, an outer fin wall(s) that face and are concentric with at least one of the base sidewalls, and an external circuitry facing fin surface between the inner fin wall(s) and the outer fin wall(s), and wherein an interior void is internal to the inner fin wall(s) of each fin from the external circuitry facing base surface to the external circuitry facing fin surfaces of each fin.

* * * * *